United States Patent
Wang et al.

(10) Patent No.: US 6,909,176 B1
(45) Date of Patent: Jun. 21, 2005

(54) STRUCTURE AND MATERIAL FOR ASSEMBLING A LOW-K SI DIE TO ACHIEVE A LOW WARPAGE AND INDUSTRIAL GRADE RELIABILITY FLIP CHIP PACKAGE WITH ORGANIC SUBSTRATE

(75) Inventors: Wen-Chou Vincent Wang, Cupertino, CA (US); Donald S. Fritz, San Jose, CA (US); Yuan Li, Sunnyvale, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/719,451

(22) Filed: Nov. 20, 2003

(51) Int. Cl.⁷ .............................................. H01L 23/10
(52) U.S. Cl. ...................... 257/706; 257/701; 257/783; 257/775
(58) Field of Search ................................. 257/701, 706, 257/783, 778, 775

(56) References Cited

U.S. PATENT DOCUMENTS

| | | |
|---|---|---|
| 5,909,056 A | 6/1999 | Mertol |
| 6,091,603 A | 7/2000 | Daves et al. |
| 6,103,550 A | 8/2000 | Camenforte et al. |
| 6,262,489 B1 | 7/2001 | Koors et al. |
| 6,472,762 B1 | 10/2002 | Kutlu |
| 6,504,242 B1 | 1/2003 | Deppisch et al. |
| 6,617,683 B2 | 9/2003 | Lebonheur et al. |
| 6,744,132 B2 | 6/2004 | Alcoe et al. |
| 6,756,685 B2 | 6/2004 | Tao |
| 6,773,963 B2 | 8/2004 | Houle |
| 6,784,535 B1 * | 8/2004 | Chiu .......................... 257/704 |
| 2004/0016996 A1 * | 1/2004 | Tang .......................... 257/678 |
| 2004/0155358 A1 * | 8/2004 | Iijima ......................... 257/778 |
| 2004/0188862 A1 * | 9/2004 | Nagarajan et al. .......... 257/787 |

OTHER PUBLICATIONS

U.S. Appl. No. 10/305,671, filed Nov. 25, 2002, entitled "Flip Chip Package With Warpage Control".
U.S. Appl. No.: 10/849,651 filed May 19, 2004 entitled: *Low Stress And Warpage Laminate Chip BGA Package*.

* cited by examiner

*Primary Examiner*—Jasmine Clark
(74) *Attorney, Agent, or Firm*—Beyer, Weaver & Thomas LLP

(57) ABSTRACT

Provided are a semiconductor low-K Si die flip chip package with warpage control and fabrication methods for such packages. The packages include heat spreaders that are attached to the low-K Si die and packaging substrate. In general, the modulus of the thermal interface material, which is used to attach the heat spreader to the low-K Si die, is selected as high as possible relative to other commercially available thermal interface materials. On the other hand, the modulus of the adhesive, which is used to attach the heat spreader via an optional stiffener to the substrate, is selected as low as possible relative to other commercially available adhesives. The result is a package with less bowing and so improved co-planarity (in compliance with industry specifications) with the surface to which it is ultimately bound. Moreover, the low-K Si die and package reliabilities are thereby enhanced.

14 Claims, 1 Drawing Sheet

STRUCTURE AND MATERIAL FOR ASSEMBLING A LOW-K SI DIE TO ACHIEVE A LOW WARPAGE AND INDUSTRIAL GRADE RELIABILITY FLIP CHIP PACKAGE WITH ORGANIC SUBSTRATE

RELATED APPLICATIONS

This application is related to U.S. patent application Ser. No. 10/305,671, filed on Nov. 25, 2002, and entitled "FLIP CHIP PACKAGE WITH WARPAGE CONTROL", the contents of which is hereby incorporated by reference.

BACKGROUND OF THE INVENTION

This invention relates generally to semiconductor chip package assembly, and in particular to flip chip package assembly. More specifically, the invention relates to a low-K Si die flip chip package incorporating warpage control structures and methods of their assembly in a semiconductor low-K Si die flip chip package.

In semiconductor device assembly, a semiconductor chip (also referred to as an integrated circuit (IC) chip or "die") may be bonded directly to a packaging substrate. Such chips are formed with ball-shaped beads or bumps of solder affixed to their I/O bonding pads. During packaging, the chip is "flipped" onto its front surface (e.g., active circuit surface) so that the solder balls form electrical connections directly between the chip and conductive metal pads, pre-solder, or traces on a packaging substrate. Packages of this type are commonly called "flip chip packages."

As advances in semiconductor technology further increase the speeds of silicon chips, a shift towards using Si die with a plurality of layers of low dielectric constant (low-K) material have been sought. Low-K material assists in the reduction of propagation delay because of the lower dielectric constant, thereby improving the electrical performance of low-K Si die. On the other hand, however, such low-K material is usually very brittle and has presented significant packaging problems (e.g., reliability).

In a conventional method for a flip chip package, a die and a packaging substrate are electrically connected and mechanically bonded in a solder joining operation. The die is aligned with and placed onto a placement site on the packaging substrate such that the die's solder bumps are aligned with electrical metal pads or pre-solder on the substrate. The substrate is typically composed of an organic material or laminate. Heat is applied causing the solder bumps to alloy and form electrical connections between the die and the packaging substrate. The package is then cooled to harden the connection.

An underfill is then applied in order to enhance the mechanical bonding of the die and substrate. An underfill material, typically a thermo-set epoxy, is dispensed into the remaining space (or "gap") between the die and the substrate. The underfill is then cured by heating.

Semiconductor packages are typically subject to temperature cycling during normal operation. In order to improve the thermal performance and reliability of the packages, heat spreaders are often used. A heat spreader may either be in an one piece heat spreader construction or in a two piece heat spreader construction (e.g., lid and stiffener). That is, a heat spreader may be composed of a lid connected to the substrate via a stiffener or may also have a form that allows for direct attachment to the substrate, such as through edges or legs that descend from the flat piece overlying the die to contact the substrate. In either case, it is referred to herein as a heat spreader.

If a two piece heat spreader is used, the stiffener may be placed around the die on the substrate where it is bonded with a heat curable organic adhesive. The stiffener (also sometimes referred to as a "picture frame") is typically a flat piece of high modulus metal having substantially the same dimensions as the package substrate with a window in its center to clear the die. The purpose of the stiffener is to constrain the substrate in order to prevent its warpage or other movement relative to the die, which may be caused by thermal cycling during reliability testing or field operation. Such movement may result from the different coefficients of thermal expansion (CTE) of the die and substrate materials, and may produce stress in the die or the package as a whole that can result in electrical and mechanical failures.

An one piece heat spreader or a lid of a two piece heat spreader is typically composed of a high thermal conductivity material and has substantially the same dimensions as the package substrate. The one piece heat spreader is typically attached to the die with a thermally conductive organic adhesive material as well as to the substrate with an organic adhesive. As for a two piece heat spreader, the lid is typically attached to the die with a thermally conductive organic adhesive material and to one side of the stiffener with an organic adhesive. The other side of the stiffener is attached to the substrate with also an organic adhesive. The purpose of the heat spreader is to disperse the heat generated during the die's operation and to keep the integrated circuit's junction temperature low.

A problem with such flip chip package constructions is that during the cool down from the solder joining temperature and the underfill curing, the whole package is highly stressed due to the different coefficients of thermal expansion (CTEs) of the substrate and die materials. Shrinkage of the substrate, typically an organic material having a relatively high CTE is much more than that of the die, which typically is silicon-based and has a much lower CTE. The high stress experienced by these bonded materials during cooling may cause them to warp or crack and cause the package structure to bow. This problem is exacerbated in the case of a relatively large die, for example one 400 mm$^2$ or larger, attached to an organic substrate. Consequently, the bow of the package may exceed the co-planarity specification for flip chip packages.

With the introduction of low-K Si dice and future extra-low-K Si dice in flip chip packages, the problems experienced by conventional flip chip packages are of even greater significance. This is because, as compared to traditional dielectric materials in conventional silicon based dice, low-K dielectric materials are brittle and tend to crack under substantially less mechanical or thermal stress. As such, it is possible for the reliability of the low-K Si die to be compromised due to cracking of the low-K dielectric material. In addition, the mismatches in thermal expansion between the low-k dielectric material, silicon based die, heat spreader, and substrate can lead to delamination or collapse of the low-K material in the packaged low-K Si die during its manufacture or during its use in the field. Low-K Si die's susceptibility to cracking, delaminating, or collapsing of the low-K material is generally applicable to all sizes of dice. Consequently, lower yield, poorer reliability, and higher costs result in the manufacturing and use of both the low-K Si dice themselves as well as the overall low-K Si die flip chip packages.

Accordingly, what is needed are low-K Si die flip chip packages and packaging methods that control package warpage within acceptable limits for incorporation into electronic devices and that redistribute the package's internal stresses in enhancing both the low-K Si die and the low-K Si die flip chip package reliabilities.

SUMMARY OF THE INVENTION

To achieve the foregoing, the present invention provides a low-K Si die flip chip package with warpage control and industrial grade reliability. The present invention also provides fabrication methods for such packages. The packages of the present invention include heat spreaders that are connected to the low-K Si die and substrate with a bond that can withstand and redistribute the considerable bowing pressures caused by the CTE mismatch between the substrate, silicon portion of the die, low-K dielectric portion of the die, solder bumps, heat spreader, and optional underfill. The result is a low-K Si die flip chip package with less bowing and so improved co-planarity (in compliance with industry specifications) with the surface (e.g., PCB board) to which it is ultimately bound. The low-K Si die flip chip package and the low-K Si die reliabilities are thereby also enhanced.

In one aspect, the invention relates to a semiconductor package that includes a low-K Si die having front and back surfaces. The front surface typically includes the solder bumps. The low-K Si die includes a plurality of layers of low-K material. The semiconductor package also includes a packaging substrate having die and board surfaces; a heat spreader; a thermal interface material coupling the heat spreader to the back surface of the low-K Si die; and an adhesive coupling the heat spreader to the die surface of the packaging substrate. The included thermal interface material has a thermal interface material modulus that is higher than or equal to 100 MPa whereas the included adhesive has an adhesive modulus that is lower than or equal to 10 MPa. Generally, however, the thermal interface material and the adhesive should have respectively as high and low of a modulus value possible as compared to other commercially available thermal interface materials and adhesives.

In one embodiment, the low-K Si die is stably integrated within the semiconductor package such that the reliability of the low-K Si die is not substantially impaired by internal stress of the semiconductor package; the internal stress being created from cycling the temperature of the semiconductor package from −55° C. to 125° C. Typically, the low-K material has a dielectric constant below that of silicon dioxide and ranges from about 2.6 to 3.5.

Dimensionally, the layer of low-K material typically has a thickness of 6 microns or less whereas the low-K Si die has a thickness in the range of 19 mil to 28 mil. The low-K Si die size ranges from 2 mm×2 mm to 30 mm×30 mm (e.g., 27 mm×25 mm; 20 mm×22 mm; 13 mm×16 mm; 4 mm×4 mm). On the other hand, the packaging substrate size ranges up to 45 mm×45 mm (e.g., 22 mm×22 mm).

In a preferred embodiment, the material properties of the thermal interface material include having a modulus about 400 MPa whereas the material properties of the adhesive include having a modulus about 4 MPa.

In general, the semiconductor package is formed where the front surface of the low-K Si die is electrically and mechanically coupled with the die surface of the packaging substrate. In particular, the low-K Si die includes a plurality of solder bumps on the front surface of the low-K Si die for electrically and mechanically coupling the front surface of the low-K Si die with the die surface of the packaging substrate. Furthermore, the plurality of solder bumps offset the low-K Si die from the packaging substrate such that a gap is formed in between the front surface of the low-K Si die and the die surface of the packaging substrate. The gap may be filled with an underfill material.

In another embodiment, the low-K Si die is an extra low-K Si die that includes a plurality of layers of extra low-K material. The extra low-K material typically has a dielectric constant between 2.2 and 2.6.

Other aspects of the present invention involve a method of forming a semiconductor package that includes (1) providing a low-K Si die having front and back surfaces and a packaging substrate having die and board surfaces, the low-K Si die including a plurality of layers of low-K material; (2) connecting a heat spreader to the back surface of the low-K Si die with a thermal interface material having a modulus that is higher than or equal to 100 MPa; and (3) connecting the heat spreader to the die surface of the packaging substrate with an adhesive having a modulus that is lower than or equal to 10 MPa.

In one embodiment, the method includes cycling the temperature of the semiconductor package from −55° C. to 125° C. to create internal stress within the semiconductor package, wherein the low-K Si die is stably integrated within the semiconductor package such that the reliability of the low-K Si die is not substantially impaired by the internal stress of the semiconductor package. Yet, in a preferred embodiment, the thermal interface material has a modulus about 400 MPa whereas the adhesive has a modulus about 4 MPa.

In another embodiment, the method of forming a semiconductor package includes electrically and mechanically coupling the front surface of the low-K Si die with the die surface of the packaging substrate. Yet, in another embodiment, the low-K Si die is an extra low-K Si die including a plurality of layers of extra low-K material.

An important aspect of the present invention involves a semiconductor package that includes a low-K Si die having front and back surfaces and a packaging substrate having die and board surfaces, the low-K Si die including a plurality of layers of low-K material; means for electrically and mechanically coupling the front surface of the low-K Si die with the die surface of the packaging substrate; means for connecting a heat spreader to the back surface of the low-K Si die with a thermal interface material having a modulus that is higher than or equal to 100 MPa; and means for connecting the heat spreader to the die surface of the packaging substrate with an adhesive having a modulus that is lower than or equal to 10 MPa.

These and other features and advantages of the invention will be presented in more detail below with reference to the associated drawings.

DETAILED DESCRIPTION OF SPECIFIC EMBODIMENTS

Figure 1:
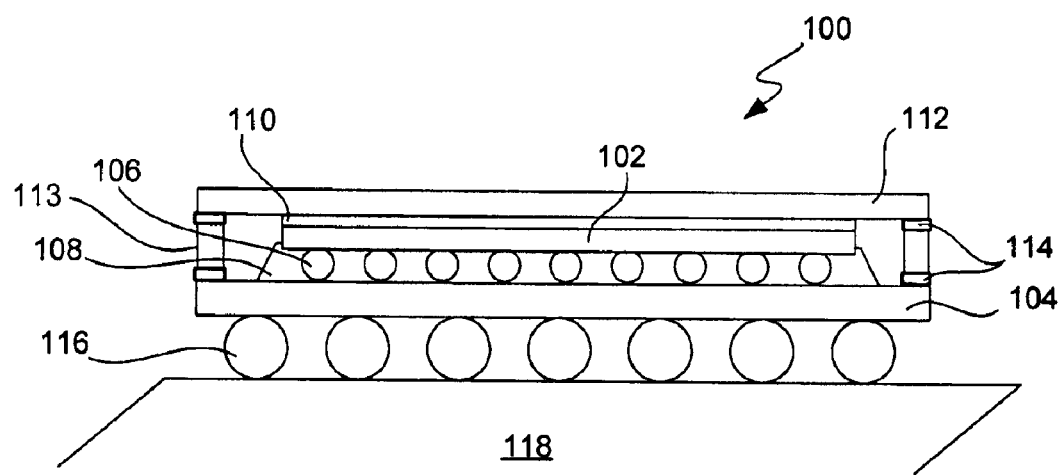
FIG. 1 illustrates a cross-sectional view of a semiconductor low-K Si die flip chip package according to various embodiments of the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

When used in combination with "comprising," "a method comprising," "a device comprising" or similar language in this specification and the appended claims, the singular forms "a", "an," and "the" include plural reference unless the context clearly dictates otherwise. Unless defined otherwise, all technical and scientific terms used herein have the same meaning as commonly understood to one of ordinary skill in the art to which this invention belongs.

The present invention provides a low-K Si die flip chip package with warpage control and industrial grade reliability (e.g., meeting thermal cycling condition B (−55° C. to 125° C.); JESD22-A104; Mil Std 1010). The present invention also provides fabrication methods for su ch packages. Conventional package constructions are inadequate to prevent bowing of packages containing low-K Si dice beyond the co-planarity tolerances of the industry standards. Furthermore, conventional package constructions are inadequate to redistribute the bowing pressures away from the low-K Si die and to the stronger areas of the package (e.g., stiffeners; substrate). The packages of the present invention include a heat spreader that is connected to the low-K Si die with a relatively high modulus bond that can withstand and redistribute the considerable bowing pressures caused by the CTE mismatch between the substrate, silicon portion of the die, low-K dielectric portion of the die, solder bumps, and optional underfill. The remaining connection of the heat spreader to the substrate is a relatively low modulus bond allowing sufficient flexibility to absorb the inherent stresses of the CTE mismatch without causing the low-K Si die or layers of low-K material therein to delaminate or crack. The result is a semiconductor low-K Si die flip chip package with less bowing and so improved co-planarity (in compliance with industry specifications) with the surface (e.g., PCB board) to which it is ultimately bound. The low-K Si die and package reliabilities are thereby also enhanced, particularly for large die sizes.

A variety of strategies are used in conjunction with the connection of the heat spreader in accordance with the invention. Specific embodiments of the present invention are illustrated and described with reference to FIG. 1. A semiconductor low-K Si die flip chip package 100 having a die (i.e., low-K Si die or extra low-K Si die) 102 and substrate 104 electrically connected by solder bumps 106 is shown. Typical low-K Si dice include a plurality of layers of low-K dielectric material, within the silicon (Si) based die (CTE of about 2.6 ppm), where the low-K dielectric material has a CTE between the range of 20 ppm and 50 ppm. In addition, the low-K dielectric material typically has a dielectric constant below that of silicon dioxide and ranges from about 2.6 to 3.5. In another embodiment, a plurality of layers of extra low-K (e.g., ultra low-K) material may be used instead of the low-K material. Extra low-K material typically has a CTE between the range of 10 ppm and 40 ppm along with a dielectric constant between 2.2 and 2.6.

Generally, the plurality of dielectric layers can have any number of low-K or extra low-K materials including, but not limited to: aerogel, xerogel, NANOGLASS® (available from Honeywell, Morristown, N.J.), FLARE™ (available from Honeywell, Morristown, N.J.), SILK™ (available from The Dow Chemical Company, Midland, Mich.), LKD® (available from JSR Micro, Sunnyvale, Calif.), CORAL® (available from Novellus Systems, Inc., San Jose, Calif.), and Black Diamond™ (available from Applied Materials, Inc., Santa Clara, Calif.). In a preferred embodiment, however, the low-K Si die includes Black Diamond™ having a CTE in the range of about 20–23 ppm. Alternatively, the low-K Si die may include SiLK™ having a CTE of about 50 ppm.

Although conventional Si die flip chip packages may incorporate some form of warpage control that may reduce the amount of warpage to within industry co-planarity specifications while allowing an enclosed conventional Si die flip-chip to operate reliably, such packages do not allow an enclosed low-K Si die to operate reliably. This is because many low-K materials are brittle and easily susceptible to cracking or damage under less mechanical or thermal stress (due to CTE mismatches) than that experienced by conventional Si die flip chip packages. Typically, the low-K materials form a plurality of layers that has a thickness which is 1/100 (e.g. 5 microns) of the overall low-K Si die thickness (e.g., 500–750 microns). In a preferred embodiment, the thickness of the plurality of low-K layers is less than 6 microns. Therefore, the present invention is directed to redistribute the mechanical or thermal stress, caused from the CTE mismatches within the low-K Si die and package, away from the low-K materials and towards stronger portions of the low-K Si die (e.g., Si portion) or overall package (e.g., stiffeners, lid, substrate, heat spreader, etc.). In addition, the present invention may allow for the low-K Si die to be stably integrated within the package such that the reliability of the low-K Si die is not substantially impaired (e.g., die being able to continue to perform reliably and function effectively) by internal stress of the package, which is caused by the CTE mismatches under temperature cycling conditions (e.g., during manufacture, industrial grade reliability testing, or use in the field). The advantages of the present invention will further be evident in cases where the low-K material is substituted by extra low-K material, such as for an extra low-K Si die flip chip package.

Die 102 may have dimensions on the order of about 4–900 mm$^2$ or 19–28 mils thick. The invention is particularly advantageously applied to packages having a large die size, for example, 400 mm$^2$ or larger (e.g., 20×20 mm, 20×23 mm, 22×22 mm, 23×28 mm, or 26×32 mm). This is because with larger amounts of heat, typically generated by larger dice, the larger the amounts of thermal and mechanical stress produced within the dice or packages. Furthermore, as compared to smaller sized dice, larger sized dice have corresponding low-K dielectric layers with larger surface areas that may be susceptible to larger amounts of mechanical stress per square area (e.g., mm $^2$). Once the die is chosen, the die may be attached to an organic substrate.

Low-K Si die 102 and packaging substrate 104 are electrically connected and mechanically bonded in a solder joining operation. The un-bonded low-K Si die has an array of solder balls or bumps arranged on its front surface. The solder is generally composed of a eutectic material having a melting point of about 180° C. or a higher melting lead material, having a melting point of about 300° C., for example.

Prior to bonding the die to a substrate, solder flux is applied to either the front surface of the die or the packaging substrate surface. The flux serves primarily to aid the flow of the solder, such that the solder balls make good contact with pre-solder covered metal pads on the packaging substrate. It may be applied in any of a variety of methods, including brushing or spraying, or dipping the die into a thin film, thereby coating the solder balls with flux. The flux generally has an acidic component, which removes oxide barriers from the solder surfaces, and an adhesive quality, which helps to prevent the die from moving on the packaging substrate surface during the assembly process. Non-cleaning or high temperature cleaning fluxes, as are known in the art, may be used.

After the flux is applied, the die is aligned with and placed onto a placement site on the packaging substrate such that the die's solder balls are aligned with pre-solder covered metal pads on the substrate. The pre-solder covered metal pads are electrically connected to the electrical traces within the substrate. Substrate 104 is typically composed of an organic or laminate material, such as fiberglass, PTFE (such as Teflon™, available form Gore, Eau Claire, Wis.) bismaleimide triazine (BT) resin, epoxy laminates or ceramic-plastic composites. Heat, typically above 200° C. (e.g., 240° C.), is applied to one or more of the die and the packaging substrate, causing the solder balls 106 to alloy and form electrical connections between die 102 and packaging substrate 104. The package is then cooled to harden the connection. Then, where necessary, the remaining flux residue is substantially removed in a cleaning step, for instance by washing with an appropriate solvent.

An underfill is optionally applied in order to enhance the mechanical bonding of the die and substrate. In one embodiment, an underfill material 108, typically a thermoset epoxy, such as is available from Hysol Corporation of Industry, CA (e.g., product numbers 4549, 8439), Ablestik Laboratories of Rancho Domingo, CA, or Namics, Reno, Nev. (e.g., product no. 8439-1) is dispensed into the remaining space (or "gap") between the die and the substrate. In a typical procedure, a bead of thermo-set epoxy, is applied along one edge of the die where it is drawn under the die by capillary action until it completely fills the gap between the die and the packaging substrate. Slight heating of the packaging substrate during dispensing of the underfill epoxy may assist the flow. In some cases, the underfill epoxy flow is further assisted by vacuum, or, alternatively, by injection of the epoxy into the gap. It should be noted that there may be other methods for applying underfill and that any underfill application may be used in conjunction with the present invention.

Underfill 108 is cured by heating the substrate and die to an appropriate curing temperature for the underfill material, generally about 150° C., and curing for a specific amount of time at the temperature. In this manner the process produces an electrically and mechanically bonded semiconductor chip assembly, with the underfill material allowing a redistribution of the stress at the connection between the die and the substrate from the solder joints only to the entire substrate-die area.

In accordance with the present invention, a conventional Si die flip chip package construction is replaced by the application of a warpage control and stress redistribution structure formed by a heat spreader having particular physical connection with the die and substrate. The warpage control and stress redistribution may be accomplished in a variety of ways.

To further elaborate, package 100 includes a heat spreader 112 composed of a high modulus, thermally conductive material with a CTE balanced with that of the substrate 104. The heat spreader material is composed of a high modulus (e.g., about 60 to 200 GPa), high thermal conductivity (e.g., about 2 to 4 W/cm-K) material, having substantially the same dimensions as the package substrate. The heat spreader material is selected to have a CTE the same as or sufficiently similar to the substrate to apply a counter stress to the die to reduce the bow of the package 100 to bring it within the tolerance of the industry co-planarity specification (about 0.20 mm or 8 mils per JDEC). Typical organic substrate materials have CTEs in the range of about 15–20 ppm, therefore the heat spreader should have a CTE in this range. Moreover, the heat spreader material should have a modulus of elasticity and thickness to balance that of the substrate. Examples of suitable materials include copper; nickel-plated copper; aluminum; and copper alloys (such as Olin194 (ASTM Spec. No. B465), available from Olin Brass, East Alton, Ill.), each with a thickness selected to achieve a balance with the force applied to the front side of die 102 by substrate 104. A heat spreader may be composed of a lid connected to the substrate via a stiffener 113 or may also have a form that allows for direct attachment to the substrate, such as through edges or legs that descend from the flat piece overlying the die to contact the substrate. In either case, it is referred to herein as a heat spreader.

This heat spreader 112 is connected to the back side of die 102. The connection is provided via a relatively high thermal conductivity, high modulus and strength thermal interface material 110 that creates a strong bond between heat spreader 112 and the back surface of die 102. The chosen thermal interface material 110 should have as high of a modulus as possible relative to other commercially available thermal interface materials for this application. In one embodiment, thermal interface material 110 includes thermal polymers having a modulus higher than or equal to 100 MPa. In a preferred embodiment, however, product JM2500 available from Honeywell, Morristown, N.J. may be used.

Heat spreader 112 is also connected to the substrate, optionally via stiffener 113. The connection of the heat spreader 112 to the substrate (and optionally the stiffener) is made with an adhesive 114. The connection to the substrate has a relatively low modulus to allow for some flexibility in the overall connection between the die and substrate. Generally, low modulus adhesives for this purpose are silicone-based adhesives. Also, the chosen adhesive 114 should have as low of a modulus as possible relative to other commercially available adhesives for this application. In one embodiment, adhesive 114 includes having a modulus lower than or equal to 10 MPa. In a preferred embodiment, however, product Ablestik/Ablebond 3003 available from Ablestik Laboratories of Rancho Domingo, Calif. may be used.

This combination of a relatively high and relatively low modulus connections of the die 102, substrate 104 and heat spreader 112 allows for sufficient flexibility to accommodate (e.g., redistribute) the inherent stresses of the CTE mismatch (thereby reducing the risk of delaminating and cracking of the die) while applying appropriate force to prevent bowing of the package outside the industry specifications. In this construction, the forces generated by the CTE mismatch are redistributed away from the die and toward the stronger portions of the package (e.g., stiffeners; substrate). As a result, low-K Si die flip chip package 100 may be more reliably used and more reliably connected to a printed circuit board 118 via a ball grid array (BGA) 116.

EXAMPLE

The following example provides details concerning semiconductor low-K Si die flip chip packages with warpage control in accordance with specific embodiments of the present invention. It should be understood the following is representative only, and that the invention is not limited by the detail set forth in this example.

A Stratix 1S60-F1020 die (e.g., 20 mm×22 mm die), available from Altera, Inc. of San Jose, modified with a plurality of low-K dielectric layers was provided along with a 33 mm×33 mm 6-layer build up organic substrate, available from Kyocera of Kyoto, Japan. The die had a CTE in the range about 2.6 ppm whereas the substrate had a CTE in the range about 17 ppm. The provided combination was subjected to warpage testing and to reliability testing (e.g., industrial grade reliability test of thermal cycling condition B (−55° C. to 125° C.); JESD22-A104; Mil Std 1010) under different modeling arrangements to determine their conformance thereof. The different modeling arrangements along with their corresponding package warpage measurements were recorded in the following table.

|  | Adhesive | Adhesive Modulus (Pa) | TIM | TIM Modulus (Pa) | Warpage (mils) |
|---|---|---|---|---|---|
| 2-pc HS | Ablestik/Ablebond 3003 | 4M | JM2500 | 0.4G | 2.9 |
| 2-pc HS | Hysol ® 1016 | 5.9G | JM2500 | 0.4G | 2.3 |
| 2-pc HS | Hysol ® 1016 | 5.9G | Gelease ™ MG120 | 0.35M | 4.8 |
| 2-pc HS | Ablestik/Ablebond 3003 | 4M | Gelease ™ MG120 | 0.35M | 5.4 |
| 2-pc HS | Dow Corning ® 6810 | 2.8M | JM2500 | 0.4G | 5.4 |

Generally, each of the different arrangements had the die positioned in registration to the metal pads coated by pre-applied eutectic solder (63/37 PbSn) and subjected to a thermal excursion above 200° C. to reflow the eutectic solder to the high lead (95/5 PbSn) solder bumps on the die. The die was then underfilled with a low modulus thermoset material (e.g., Namics 8439-1), which had suitable thermal characteristics to improve the thermal cycling reliability of the solder bumps of the attached chip. If a window frame (e.g., stiffener) was used, copper was chosen for the window frame material since it more closely matches the CTE of the organic substrate material and thus does not cause high stresses between the window frame and the substrate. Window frame dimensions were selectively chosen so that the die is recessed below the level of the window frame. This was done so as to apply a relatively high modulus thermal interface material between the die and the heat spreader for maximum thermal dissipation.

Reliability testing for such packages generally involves subjecting the different modeling arrangements to industry available and accepted reliability testing standards such as those established by the Electronic Industries Association (EIA) or the Joint Electron Device Engineering Council (JEDEC). For example, JESD22-A104 and Mil Std 1010. In one embodiment, industrial grade reliability testing is performed and includes cycling the temperature between −55° C. to 125° C. and/or running 1000 cycles. Temperature cycling is conducted to determine the resistance of the low-K Si die to high and low temperature extremes. This environmental stress test is designed to simulate the extensive changes in temperature to which the low-K Si die and the package may be exposed. Typically, to pass the test, the low-K Si die and/or layers of low-K material should not show signs of damage such as cracking, chipping, delamination, or breaking.

In measuring the warpage or bow during warpage testing, a commercially available warpage or bow measuring tool was used for effectively comparing to industry co-planarity specifications (e.g., JEDEC specification MS-034). For example, RVSI Models LS7700, LS3700, and LS7350 DB, available from Robotic Vision Systems, Inc. of Nashua, N.H. may be used. Generally, warpage testing is conducted and measured after the low-K Si die flip chip package has been formed and before the low-K Si die flip chip package is subjected to reliability testing.

As shown in the first modeling arrangement listed in the table, which is a preferred embodiment, a two-piece heat spreader (HS) (e.g., lid and stiffener) was used. The lid was attached to the back surface of the die with thermal interface material (TIM) JM2500 whereas the stiffener was attached to the lid and substrate with an adhesive Ablestik/Ablebond 3003. JM2500 has a relatively high modulus of 0.4 GPa whereas Ablestik/Ablebond 3003 has a relatively low modulus of 4 MPa. Overall, this first modeling arrangement provided a conforming package warpage measurement (2.9 mils) that came well within the required 8 mils co-planarity specification and provided the best conforming (e.g., passing) low-K Si die and package reliability results under reliability testing.

As seen from the table above, other modeling arrangements were also provided. Each modeling arrangement produced a different measured result. The recorded results indicated increased low-K Si die and package reliabilities when the applied thermal interface material had a relatively high modulus and the applied adhesive had a relatively low modulus. For instance, the second modeling arrangement also comprised of a two-piece heat spreader where JM2500 was used as the thermal interface material. Instead of using Ablestik/Ablebond 3003 for attaching the stiffener, another relatively low modulus adhesive Hysol® 1016 was used. Hysol® 1016 (available from Henkel Loctite Corporation, Rocky Hill, Conn.) has a modulus of about 5.9 GPa. Again, a low warpage (i.e., 2.3 mils) measurement and an industrial grade reliability testing result that was nearly as successful as to that of the first modeling arrangement were achieved. Other adhesives used in the modeling arrangements include Dow Corning® 6810 (available from The Dow Chemical Company, Midland, Mich.) whereas other TIM's used include Gelease™ M0120 (available from Lord Corporation, Cary, N.C.).

CONCLUSION

The foregoing invention presents many advantages over conventional flip chip packages. For example, the ability to use organic substrates instead of ceramic substrates facilitates in lowering costs, improving electrical performance, and reducing board level reliability problems. Another advantage is that the foregoing invention provides a packaging solution for low-K and future extra low-K Si dice.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A semiconductor package comprising:
 a low-K Si die having front and back surfaces, the low-K Si die including a plurality of layers of low-K material;

a packaging substrate having die and bound surfaces;

a heat spreader;

a thermal interface material coupling the heat spreader to the back surface of the low-K Si die, the thermal interface material having a thermal interface material modulus that is higher than or equal to 100 MPa; and an adhesive coupling the heat spreader to the die surface of the packaging substrate, the adhesive having an adhesive modulus that is lower than or equal to 10 MPa.

2. A semiconductor package as recited in claim 1, wherein the low-K Si die is stably integrated within the semiconductor package such that the reliability of the low-K Si die is not substantially impaired by internal stress of the semiconductor package, the internal stress being created from cycling the temperature of the semiconductor package from −55° C. to 125° C.

3. A semiconductor package as recited in claim 1, wherein the low-K Si die is an extra low-K Si die including a plurality of layers of extra low-K material.

4. A semiconductor package as recited in claim 1, wherein the layer of low-K material has a thickness of 6 microns or less.

5. A semiconductor package as recited in claim 1, wherein the low-K Si die has a thickness in the range of 19 mil to 28 mil.

6. A semiconductor package as recited in claim 1, wherein the low-K Si die size ranges from 2 mm×2 mm to 30 mm×30 mm.

7. A semiconductor package as recited in claim 1, wherein the packaging substrate size ranges up to 45 mm×45 mm.

8. A semiconductor package as recited in claim 1, wherein the thermal interface material is has a modulus about 400 MPa.

9. A semiconductor package as recited in claim 1, wherein the adhesive has a modulus about 4 MPa.

10. A semiconductor package as recited in claim 1, wherein the front surface of the low-K Si die is electrically and mechanically coupled with the die surface of the packaging substrate.

11. A semiconductor package as recited in claim 10, wherein the low-K Si die includes a plurality of solder bumps on the front surface of the low-K Si die for electrically and mechanically coupling the front surface of the low-K Si di with the die surface of the packaging substrate.

12. A semiconductor package as recited in claim 11, wherein the plurality of solder bumps offset the low-K Si die from the packaging substrate such that a gap is formed in between the front surface of the low-K Si die and the die surface of the packaging substrate.

13. A semiconductor package as recited in claim 12, wherein the gap is filled with an underfill material.

14. A semiconductor package, comprising:

a low-K Si die having front and back surfaces and a packaging substrate having die and board surfaces, the low-K Si die including a plurality of layers of low-K material;

means for electrically and mechanically coupling the front surface of the low-K Si die with the die surface of the packaging substrate;

means for connecting a heat spreader to the back surface of the low-K Si die with a thermal interface material having a modulus that is higher than or equal to 100 MPa; and means for connecting the heat spreader to the die surface of the packaging substrate with an adhesive having a modulus that is lower than or equal to 10 MPa.

* * * * *